United States Patent [19]

Reichmanis et al.

[11] Patent Number: 4,521,274
[45] Date of Patent: Jun. 4, 1985

[54] BILEVEL RESIST

[75] Inventors: Elsa Reichmanis; Cletus W. Wilkins, Jr., both of Westfield, N.J.

[73] Assignee: AT&T Bell Laboratories, Murray Hill, N.J.

[21] Appl. No.: 613,884

[22] Filed: May 24, 1984

[51] Int. Cl.³ ............... B44C 1/22; C03C 15/00; C03C 25/06; B29C 17/08
[52] U.S. Cl. .................... 156/643; 156/646; 156/652; 156/655; 156/659.1; 156/904; 204/192 E; 427/41; 427/43.1; 430/312; 430/313
[58] Field of Search ........... 156/643, 646, 652, 655, 156/659.1, 661.1, 668, 904; 204/192 E; 427/41, 43.1, 54.1; 430/312, 313, 314–319, 329, 270, 280

[56] References Cited

U.S. PATENT DOCUMENTS 4,426,247  1/1984  Tamamura et al. ............ 156/646 X
4,481,049  11/1984  Reichmanis et al. ........... 156/646 X Primary Examiner—William A. Powell
Attorney, Agent, or Firm—Bruce S. Schneider

[57] ABSTRACT

Excellent resolution in the lithographic fabrication of electronic devices is achieved with a specific bilevel resist. This bilevel resist includes an underlying layer formed with a conventional material such as a novolac resist baked at 200° C. for 30 minutes and an overlying layer including a silicon containing material such as that formed by the condensation of formaldehyde with a silicon-substituted phenol. This bilevel resist has the attributes of a trilevel resist and requires significantly less processing.

12 Claims, 1 Drawing Figure

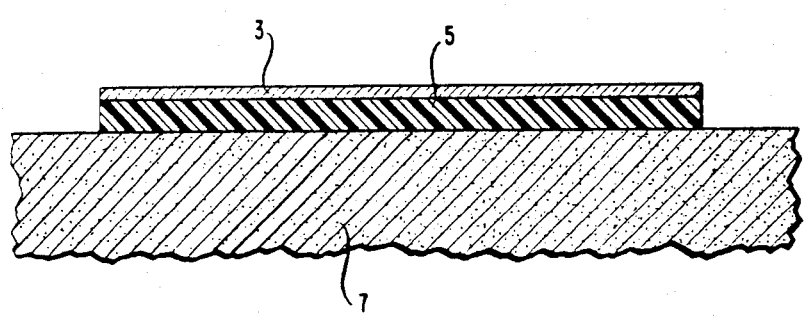

BILEVEL RESIST

BACKGROUND OF THE INVENTION

1. Field of the Invention

This invention relates to the fabrication of electronic devices and, in particular, to fabrication procedures utilizing lithographic techniques.

2. Art Background

Trilevel resists have been utilized in the formation of electronic devices and are especially suitable for the lithographic definition of small features, i.e., features smaller than 2 μm. These resists include an underlying layer generally deposited directly on the substrate being processed. (The substrate in this context is the semiconductor body including, if present, various levels of, for example, metallization, doped semiconductor material, and/or insulators.) Since the substrate typically does not have a planar surface, this layer is usually deposited with a thickness that is sufficient, despite the underlying irregularity, to present an essentially planar upper surface. An intermediary layer is then formed on this planarizing layer. The composition of the intermediary layer is chosen so that it is etched at least 5 times slower than the planarizing layer by a plasma that is capable of removing the underlying resist layer. A third layer (an overlying layer) that is delineable by exposure to radiation and by subsequent treatment with a suitable developing medium, is formed on the intermediary layer.

The trilevel resist is patterned by first delineating the overlying layer in the desired pattern. This pattern is then transferred to the intermediary layer through conventional techniques such as dry processing, e.g., reactive ion etching, causing an uncovering, in the desired pattern, of the underlying layer. The uncovered regions, generally of organic materials, are then removed with an oxygen plasma. Intermediary layers of materials such as silicon dioxide, that are essentially unaffected by an oxygen plasma, are employed to avoid its destruction during plasma processing and thus degradation of the transferred pattern.

Although the trilevel resist has proven to be an excellent expedient for producing fine features during semiconductor device fabrication, it does involve several discrete processing steps. Since there is always a desire to reduce processing steps and the associated costs, there has been a significant effort to develop a bilevel system yielding the advantages, i.e., planarization and high resolution, of a trilevel system. Attempts typically have been made to combine the attributes of the intermediary layer and the overlying layer into a single layer. To effect this combination, the resultant layer must be both delineable and also be at least 5 times more resistant than the underlying layer to the medium utilized to develop the underlying layer. Several materials have been reported as candidates for use as this combined overlying material. For example, materials represented by the formulae

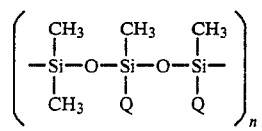

(Q is methyl, phenyl, and/or vinyl)

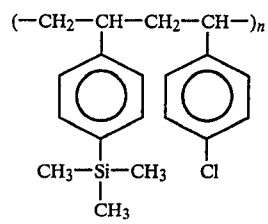

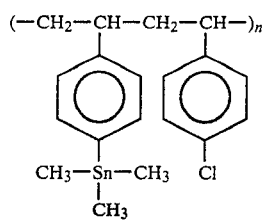

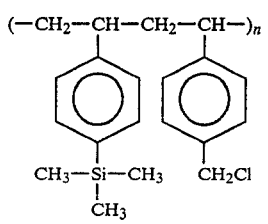

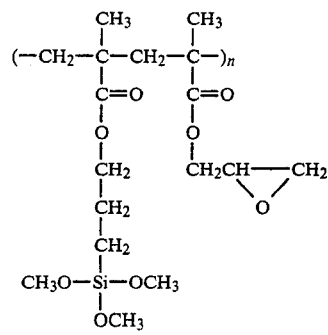

and

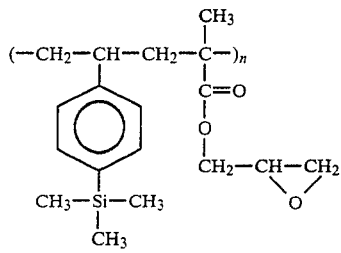

have been reported in the literature. (See Regional Technical Conference, "Photopolymers Principles—Processes and Materials," J. M. Shaw et al, Nov. 8, 1982, Ellenville, N.Y. (for compound 1), 1983 International Symposium on Electron, Ion and Photon Beams, S. A. MacDonald, May 31, 1983, Los Angeles, Calif. (for compounds 2 and 3), and Journal of the Electrochemical Society, 130, Suzuki et al, page 1962 (1983), for the remaining compounds.) Although these materials are resistant to an oxygen plasma, each is not entirely acceptable for other reasons. For example, all these materials are negative resists. Although negative resists are not inherently undesirable, most of the masks presently utilized for exposing resists and, in particular, trilevel resists, have been developed for positive resists. Thus, the use of a negative resist would require a complete change in the mask sets being utilized to produce semiconductor devices. Although this change is possible, it is costly and would not be desired. Additionally, the material represented by formula (1) either lacks dimensional stability and tends to creep during processing for thick films, or is highly defective when utilized in a thin layer. Thus, one of the purposes for utilizing a multilayer resist— increased resolution—is lost.

As a result, although there is a strong incentive to develop a bilevel resist having the attributes of a trilevel configuration, each proposal has, as yet, not been entirely satisfactory.

SUMMARY OF THE INVENTION

A bilevel resist that yields a planar surface, has excellent stability, undergoes a positive exposure to radiation, e.g., ultraviolet radiation, and which allows excellent resolution, e.g., resolution of 1 $\mu$m or finer, has been found. This bilevel resist includes a conventional underlying layer, e.g., a novolac based resist such as hard baked HPR-204 (a proprietary product of the Philip A. Hunt Chemical Company which is basically a novolac resin with a naphthoquinone diazide sensitizer), and an overlying layer containing material formed by the condensation of monomers including formaldehyde and/or acetaldehyde and a silicon-substituted phenol, e.g., m-trimethylsilylphenol or p-trimethylsilylmethylphenol. Exemplary of suitable materials are compounds represented by the formulae

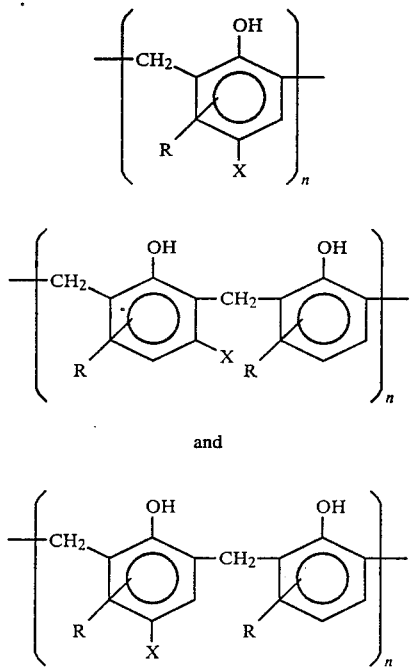

where R is hydrogen or methyl and X contains silicon, e.g., Si(CH$_3$)$_3$ or CH$_2$Si(CH$_3$)$_3$. These materials are sensitive to deep ultraviolet and electron radiation alone but are particularly advantageously employed with a solubility inhibitor such as a substituted naphthoquinone diazide, where they are sensitive to electromagnetic radiation in the wavelength range 250 nm to 450 nm.

BRIEF DESCRIPTION OF THE DRAWING

The FIGURE is illustrative of structures involved in the invention.

DETAILED DESCRIPTION

As discussed, the inventive bilevel resist includes an underlying planarizing layer, 5, and an overlying layer, 3, that is delineable and that is resistant to the medium utilized to develop the underlying layer. These layers are formed on a substrate, 7. The material utilized for the underlying layer is not critical and typically includes organic materials such as novolac and polyimide resins, e.g., (1) HPR-204 or AZ-1350 or AZ-1350J (proprietary products of Shipley Co., Inc., which are basically novolac resins with a substituted napthoquinone diazide solution inhibitor) baked at 200° C. for 0.5 hours, and (2) polymides such as Pyralin (i.e., proprietary material of E. I. duPont deNemours and Company, Inc.).

The underlying layer material, unlike a typical resist, need not undergo a chemical change upon exposure to radiation. It is only necessary that the material of the underlying resist layer be removable with an oxygen plasma and not appreciably dissolve in the solvent utilized to form the overlying layer. (See VLSI Technology, Chapter 8, edited by S. M. Sze, McGraw-Hill, New York (1983) for a complete description of the removal of materials through plasma techniques.) Appreciable dissolution in this context means the intermixing of the overlying layer with the underlying layer to a depth of more than 500 Angstroms of the underlying layer. For example, when cyclopentanone is employed to spin-coat the upper layer, poly(methyl methacrylate) is not a desirable choice for the lower layer since appreciable intermixing does occur. The thickness of the underlying layer depends on the size of the surface irregularities in the substrate. For typical structures utilized in the formation of semiconductor devices, layer thicknesses greater than 1 $\mu$m yield an essentially planar surface. However, thicknesses greater than 4 $\mu$m, although not precluded, are generally uneconomic and require excess processing time.

The thickness of the overlying layer depends on the desired resolution. Generally, the thicker the layer, the poorer the resolution. For resolutions less than 2 $\mu$m, layer thicknesses in the range 0.3 $\mu$m to 1.0 $\mu$m are generally utilized. Suitable layer thicknesses for either the underlying or overlying layers are easily obtained by conventional techniques such as by dissolving the material that is to form the layer in a solvent, e.g., cyclopentanone or 2-methoxyethyl acetate, and spin-coating the final layer onto the substrate. (A full description of spin-coating is found in *Photoresist Materials and Processes*, W. S. DeForrest, page 223, McGraw-Hill, New York, 1975). The spinning speed utilized in the coating procedure determines the layer thickness and is controlled to yield the desired result.

The material of the overlying layer should include a polymer that can be postulated as the condensation product of (1) formaldehyde and/or acetaldehyde with (2) at least one compound represented by the formulae

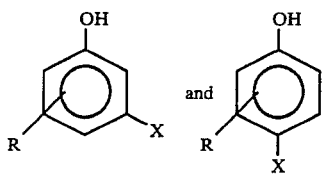

(8)

where R is preferably hydrogen or methyl and where X is a silicon containing entity such as $(C_yH_{2y})SiR',R''R'''$ and where $0 \leq y \leq 3$ and R', R'', and R''' are individually either methyl, ethyl, or phenyl and optionally, if desired, with 3) phenol or a substituted phenol. (The entities R', R'', and R''' should not all be phenyl and when $y=0$, X should preferably be in the meta position.) Although the polymers for the overlying layer are generally formed by condensation, other synthesis routes are not precluded provided the product employed, irrespective of the formation procedure, can be postulated as formed by condensation, whether or not condensation is in fact possible. The precise silicon containing moiety, X, is not critical provided the glass transition temperature ($T_g$) of the resulting composition formed from the monomers is higher than 30° C., preferably higher than 60° C. Typically the $T_g$ of the polymer is excessively low, i.e., lower than 30° C., if extremely long carbon chains, i.e., chains having more than 3 carbons, are utilized, or if the substituents bound to the silicon have a chain length greater than that associated with ethyl, methyl, or phenyl groups. Similarly, the amount of phenol incorporated, the amount of substituted phenol incorporated, and the substituents on any substituted phenol should also be chosen so that the polymer $T_g$ remains above 30° C.

Additionally, excessively large carbon containing moieties (R, R', R'', R''') and excessive amounts of phenols or substituted phenols without silicon moieties are not desirable since they significantly decrease the resistance of the material to oxygen containing plasmas. Generally, it is desirable to maintain the weight percentage of silicon in the polymer to more than 5 percent. For weight percentages lower than 5 percent, adequate oxygen resistance is not obtained.

The use of the disclosed silicon containing polymers themselves is not precluded. If the materials alone are exposed with an electron beam, the material works negatively or positively, depending on the processing, as reported for novolac resists by S. R. Fahrenholtz, *Journal of Vacuum Science and Technology*, 19, page 1111 (1981), and suitable conditions should be chosen to yield the desired tone, i.e., positive or negative. The polymers are also typically relatively slowly exposed by ultraviolet radiation, i.e., require an exposure dose greater than 1 joule/cm², to produce images having dimensions of 2 μm or less and are negative working. Thus, for ultraviolet radiation, it is desirable but not essential to increase sensitivity, for example, to a level where relatively fast exposure, i.e., 0.5 joule/cm² or less, is possible. This increase is accomplished in one embodiment by adding a solubility inhibitor that is sensitive to radiation. (See Introduction to Microlithography, edited by L. F. Thompson et al, *ACS Symposium Series* 119, Chapter 3, American Chemical Society, Washington, D.C. (1983) for a description of suitable inhibitors as described in conjunction with materially different polymers.) Typically, the inhibitor is used at a concentration of 5 to 40 weight percent of the polymer. At concentrations greater than 40 percent, excessive sensitivity loss occurs, while at concentrations less than 5 percent, excessive thinning occurs upon development.

Fabrication of all the previously discussed polymers is done by conventional techniques such as condensation reaction, which is extensively discussed in a variety of texts, such as *Preparative Methods of Polymer Chemistry*, W. R. Sorenson and T. W. Campbell, Interscience (1961). The molecular weight of the resulting polymer also influences lithographic behavior. Typically, molecular weights in the range 500 to 20,000 are desirable. Molecular weights greater than 20,000 are difficult to achieve, while molecular weights lower than 500 result in a poor differential solubility between the exposed and unexposed regions of the overlying layer.

To process the inventive bilevel resists, the overlying layer is exposed with suitable radiation, such as ultraviolet radiation. In the case of a substituted naphthoquinone diazide inhibitor, radiation in the wavelength range 250 nm to 450 nm is generally utilized. Typically, incident exposure doses in the range 0.1 joule/cm² to 1 joule/cm² are employed. The specific exposure dose employed should be sufficient to cause a chemical reaction from the surface of the region that is subjected to radiation, through the volume underlying the exposed surface region, to the underlying resist material. Thus, the exposure should be sufficient so that upon development, the underlying resist material in the exposed regions in uncovered.

Development is accomplished through the use of solvents such as an aqueous base, e.g., sodium hydroxide or tetramethyl ammonium hydroxide. Typically, the solvent should remove the exposed region of the overlying layer without removing more than 25 volume percent of the unexposed regions of the overlying layer. After the overlying layer is developed, its pattern is transferred to the underlying layer. This pattern transfer is accomplished by subjecting the substrate to an oxygen plasma. This oxygen plasma technique has been extensively described in Introduction to Microlithography, Chapter 6, edited by L. F. Thompson, C. G. Willson, and M. J. Bowden, American Chemical Society, Symposium Series 219, Washington, D.C. (1983). Typically, power densities in the range 0.0015 watts/cm³ to 0.15 watts/cm³ are utilized to maintain the plasma so that removal rates for the underlying layer in the range 0.1 μm/minute to 0.3 μm/minute are achieved. (Under these conditions, the overlying layer is etched at 0.01 μm/minute to 0.05 μm/minute.) Generally, the plasma is struck in a gas containing oxygen. Total gas pressures in the range 0.01 Torr to 0.2 Torr are generally employed.

After the pattern has been transferred to the underlying layer, the delineated bilevel resist is utilized for processing steps such as metallization, dopant diffusion, or etching for the substrate, 7 in the FIGURE. The resist is then removed, and the processing of the substrate is completed to form the desired electronic devices.

The following example is illustrative of the invention.

EXAMPLE

A. Preparation of m-Trimethylsilylphenol Monomer

Approximately 86.5 grams (0.5 mole) of m-bromophenol was put into a 500 ml round-bottom flask. This material was heated to 50° C., and 44.8 grams (2.8 moles) of hexamethyldisilazane was added dropwise over a course of 1 hour to prevent vigorous gas evolution. After addition of the hexamethyldisilazane, the temperature was maintained at 50° C. for 2 hours. The resulting composition was vacuum distilled at a pressure of 6 mm and at a temperature of 100° C. The resulting distillate was collected and was confirmed by nuclear magnetic resonance spectroscopy to be m-bromophenoxytrimethylsilane.

Approximately 5.35 grams (2.2 moles) of magnesium was combined with 10 ml of dry and distilled tetrahydrafuran (THF) and 0.3 ml of methyl iodide in a flask having a dry nitrogen atmosphere. Approximately 60 ml of dry and distilled THF was combined with 49 grams (0.20 mole) of m-bromophenol, and the resulting solution was added dropwise, at room temperature over a period of 1½ hours, to the magnesium containing composition. After addition of the solution, the resulting mixture was heated at reflux temperature for 1 hour and then cooled to room temperature. To this reaction mixture was added dropwise 22.8 grams (0.21 mole) of chlorotrimethylsilane during the course of approximately 30 minutes. THe resulting mixture was heated at reflux temperature for 1 hour and cooled to room temperature.

Approximately 100 ml of distilled water was added to the reaction composition, and the resulting aqueous fraction was separated and discarded. The remaining fraction was washed twice with 40 ml of distilled water and subsequently washed with 50 ml of saturated aqueous sodium chloride solution. The material was dried over magnesium sulfate, and the solvent was removed. The composition was then distilled at 110° C. and 4.5 mm of mercury. The procedure yielded 30 grams of m-trimethylsilylphenoxytrimethylsilane (m-TSPTS).

Approximately 30 grams of m-TSPTS was dissolved in 9 ml of 95 percent ethanol. To this solution was added 1 drop of hydrochloric acid and 4 ml of distilled water. The resulting mixture was agitated for 5 minutes, allowed to stand for 15 minutes, and washed twice with 30 ml aliquots of distilled water. The aqueous fraction was discarded, and the remaining fraction was dried and collected to yield about 22 grams of m-trimethylsilylphenol.

A 500 ml flask fitted with a mechanical stirrer and condenser was charged with 20 grams (0.21 mole) of phenol, 20 grams (0.12 mole) of m-trimethylsilylphenol, 26 ml of 37 percent aqueous formaldehyde, and 1.26 grams (0.1 mole) of oxalic acid. The mixture was stirred and heated at reflux temperature for 1 hour and allowed to cool to room temperature. The resulting mixture was washed with 50 ml of distilled water. The aqueous fraction was discarded, and the remaining fraction was heated at 120° C. at a pressure of 15 mm of mercury for 30 minutes. After the heating procedure, the resulting product was analyzed using nuclear magnetic resonance spectroscopy and exhibited a polymer where approximately 10 percent of the trimethylsilyl groups was lost during preparation. The polymer contained 7 percent by weight silicon, as determined by elemental analysis. A polymer with 9 percent silicon was prepared by the same procedure except 25 grams (0.15 mole) of m-trimethylsilylphenol was employed in the reaction with the phenol and formaldehyde.

B. Preparation of Bilevel Resist

Sufficient HPR-204 (a proprietary product of the Philip A. Hunt Chemical Company which is basically a novolac based resist with a quinone diazide inhibitor) was spun on a silicon substrate (3 inches in diameter) to yield a resist layer thickness of approximately 1 μm. The resist material was baked in an air oven for 1 hour at 200° C. Approximately 5 grams of the polymer prepared in Paragraph A was dissolved together with 1.25 grams of o-quinone diazide in 20 ml of cyclopentanone. The resulting solution was filtered through a 1.0 μm Teflon (a registered trademark of E. I. dupont deNemours and Company, Inc.) filter. A sufficient amount of the solution was placed on the baked novolac resist so that upon spinning at 2,000 rpm, a layer having a thickness of approximately 4,000 Angstroms was formed. The resulting structure was baked at 90° C. for 30 minutes in an air ambient.

C. Exposure and Development

A mercury arc lamp was utilized to expose the resulting resist for 9 seconds through a chrome-on-glass contact resolution mask having feature sizes ranging from 0.5 μm to 10 μm. (This exposure was performed on a Kulicke and Soffa aligner.)

The exposed resist was immersed for 60 seconds in AZ developer (a proprietary product of Shipley Co., Inc., which is basically an aqueous potassium hydroxide solution) diluted in a ratio of 1:8 with distilled water. The resulting structure was then rinsed for 15 seconds with distilled water.

D. Reactive Ion Etching

The pattern of the upper layer was transferred to the lower layer utilizing a Model C71 r.f./d.c. sputtering module purchased from Cook Vacuum Product, Inc. An oxygen flow rate of 15 ml/minute was established to yield an etching chamber pressure of approximately 20 μm. An r.f. discharge was struck in the resulting ambient utilizing an r.f. power of approximately 15 watts with a bias of 225 volts. The etching was continued for approximately 10 minutes. The resulting structure was then inspected using scanning electron microscopy on a Cambridge stereoscan 100 SCM which indicated a resolution as good as 1 μm.

What is claimed is:

1. A process of fabricating a device comprising the steps of forming a composition including a radiation-sensitive composition on a substrate, patterning at least a portion of said region and further processing said substrate
CHARACTERIZED IN THAT
said region comprises a polymer that is represented by the formula

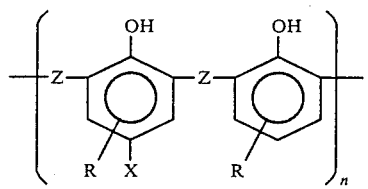

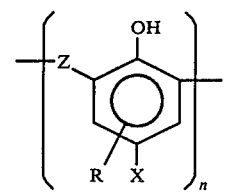

-continued or

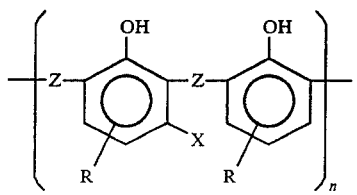

or

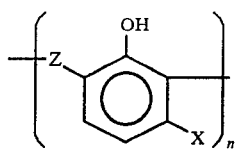

where Z is

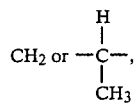

where R is hydrogen or methyl, and where X contains silicon and is chosen so that $T_g$ of said composition is higher than 30° C., and the silicon weight percentage of said composition is at least 5.

2. The process of claim 1 wherein X is $(C_yH_{2y})$-SiR'R"R'" where $0 \leq y \leq 3$ and R', R", and R'" are individually methyl, ethyl, or phenyl.

3. The process of claim 2 wherein said composition includes a region capable of selective removal that is interposed between said radiation-sensitive region and said substrate.

4. The process of claim 3 wherein said selective removal is accomplished with an oxygen plasma during said patterning of said composition.

5. The process of claim 2 wherein said composition includes a solubility inhibitor.

6. The process of claim 5 wherein said patterning comprises exposing said radiation-sensitive composition to ultraviolet radiation and developing said composition with a solvent.

7. The process of claim 5 wherein a region capable of selective removal is interposed between said radiation-sensitive region and said substrate.

8. The process of claim 7 wherein said selective removal is accomplished with an oxygen plasma during said patterning of said composition.

9. The process of claim 1 wherein said composition includes a solubility inhibitor.

10. The process of claim 9 wherein said solubility inhibitor comprises a naphthoquinone diazide.

11. The process of claim 9 wherein a region capable of selective removal is interposed between said substrate and said radiation-sensitive region.

12. The process of claim 11 wherein said patterning is accomplished by exposing said radiation-sensitive region, developing said region, and transferring the resulting pattern to said interposed region with an oxygen plasma.

* * * * *